US007343856B2

(12) United States Patent
Blöhdorn

(10) Patent No.: US 7,343,856 B2
(45) Date of Patent: Mar. 18, 2008

(54) APPARATUS FOR CONTROLLING THE TEMPERATURE OF AN EXPOSURE DRUM IN A PRINTING PLATE EXPOSER

(75) Inventor: Gerhard Fritz Blöhdorn, Schönkirchen (DE)

(73) Assignee: Heidelberger Druckmaschinen AG, Heidelberg (DE)

( * ) Notice: Subject to any disclaimer, the term of this patent is extended or adjusted under 35 U.S.C. 154(b) by 0 days.

(21) Appl. No.: 10/695,365

(22) Filed: Oct. 28, 2003

(65) Prior Publication Data

US 2004/0168602 A1 Sep. 2, 2004

(30) Foreign Application Priority Data

Feb. 27, 2003 (DE) ................................ 103 08 436

(51) Int. Cl.
*B41C 1/00* (2006.01)
*G03F 7/20* (2006.01)
*B41C 1/10* (2006.01)

(52) U.S. Cl. .................... 101/467; 101/401.1; 101/487

(58) Field of Classification Search ................ 101/217, 101/218, 350, 350.5, 487, 488
See application file for complete search history.

(56) References Cited

U.S. PATENT DOCUMENTS 2,972,298 A * 2/1961 DeMarchi et al. .......... 101/211
3,956,986 A * 5/1976 Wirz et al. ............... 101/350.3
4,617,864 A * 10/1986 Niedermaier et al. ....... 101/219
4,913,224 A * 4/1990 Moran ......................... 165/89
4,920,881 A * 5/1990 Tafel .......................... 101/488
5,074,213 A * 12/1991 Kurosawa ................... 101/487
5,272,971 A 12/1993 Fredericks
5,535,674 A * 7/1996 Vrotacoe et al. ............ 101/216
5,748,225 A 5/1998 Ziph-Schatzberg
5,784,957 A * 7/1998 Rau et al. ................... 101/142
5,813,334 A * 9/1998 Blanchard ................... 101/217
5,881,643 A * 3/1999 Silvestre ..................... 101/217
5,967,036 A * 10/1999 Marmin et al. ............. 101/219
6,065,402 A * 5/2000 Feller et al. ............. 101/350.5
6,101,944 A 8/2000 Schmid et al.
6,105,651 A * 8/2000 Leanna ....................... 156/555
6,109,177 A * 8/2000 Wech et al. ............. 101/349.1
6,250,221 B1 * 6/2001 Tice ........................... 101/246
6,594,340 B2 7/2003 Saito .......................... 378/130
6,640,705 B1 * 11/2003 Stuhlmiller et al. ........ 101/217
6,688,223 B1 * 2/2004 Dauner ....................... 101/217
2002/0023557 A1 2/2002 Hauck
2002/0112636 A1 8/2002 Desaulniers et al.

FOREIGN PATENT DOCUMENTS

DE 44 31 188 A1 5/1995

(Continued)

*Primary Examiner*—Daniel J. Colilla
(74) *Attorney, Agent, or Firm*—Laurence A. Greenberg; Werner H. Stemer; Ralph E. Locher

(57) ABSTRACT

An apparatus for controlling the temperature of a recording material, in particular a printing plate, in an exposer for recording printing originals. An exposer has an exposure drum for holding the printing plate, and has a cylinder. An internal pipe and webs connect the cylinder to the internal pipe. Using a rotary lead-through, a temperature-control liquid is led into the internal tube of the exposure drum and, by thermal conduction via the webs and the cylinder, keeps the printing plate at a constant temperature.

14 Claims, 2 Drawing Sheets

FOREIGN PATENT DOCUMENTS

| | | | | |
|---|---|---|---|---|
| DE | 195 10 797 | A1 | | 9/1996 |
| DE | 197 43 770 | A1 | | 4/1999 |
| DE | 101 36 747 | A1 | | 3/2002 |
| DE | 101 37 166 | A1 | | 3/2002 |
| EP | 612617 | A1 | * | 8/1994 |
| EP | 0 733 478 | A1 | | 9/1996 |
| JP | 61-252914 | | | 11/1986 |
| JP | 6-338491 | | | 12/1994 |
| JP | 9-134690 | | | 5/1997 |
| JP | 10-282770 | | | 10/1998 |
| JP | 2000-506997 | | | 6/2000 |
| JP | 2002-216683 | | | 8/2002 |
| JP | 2003020913 | A | | 1/2003 |
| WO | 97/35233 | | | 9/1997 |

* cited by examiner

APPARATUS FOR CONTROLLING THE TEMPERATURE OF AN EXPOSURE DRUM IN A PRINTING PLATE EXPOSER

BACKGROUND OF THE INVENTION

Field of the Invention

The invention relates to the field of electronic reproduction technology and pertains to an apparatus for controlling the temperature of an exposure drum in an exposer for recording printing originals on printing plates.

In reproduction technology, printing originals for printed pages that contain all the elements to be printed such as texts, graphics and images are produced. For color printing, a separate printing original is produced for each printing ink and contains all the elements that are printed in the respective color. For four-color printing, these are the printing inks cyan, magenta, yellow and black (CMYK). The printing originals separated in accordance with printing inks also referred to as color separations. The printing originals are generally screened and, by using an exposer, are exposed onto films, with which printing plates for printing large editions are then produced. Alternatively, the printing originals can also be exposed directly onto printing plates in special exposure devices, or they are transferred directly as digital data to a digital printing press. There, the printing-original data is then exposed onto printing plates, for example with an exposing unit integrated into the printing press, before the printing of the edition begins immediately thereafter.

According to the current prior art, the printing originals are reproduced electronically. In this case, the images are scanned in a color scanner and stored in the form of digital data. Texts are generated with text processing programs and graphics with drawing programs. Using a layout program, the image, text and graphic elements are assembled to form a printed page. Following the separation into the printing inks, the printing originals are then present in digital form. The data formats largely used nowadays to describe the printing originals are the page description languages PostScript and portable document format (PDF). In a first step, the PostScript or PDF data is converted in a raster image processor (RIP) into color separation values for the CMYK color separations before the recording of the printing originals. In the process, for each image point, four color separation values are produced as tonal values in the value range from 0 to 100%. The color separation values are a measure of the color densities with which the four printing inks cyan, magenta, yellow and black are printed on the printing material. In special cases, in which printing is carried out with more than four colors (decorative colors), each image point is described by as many color separation values as there are printing inks. The color separation values can be stored, for example, as a data value with 8 bits for each image point and printing ink, with which the value range from 0% to 100% is subdivided into 256 tonal value steps.

The data from a plurality of printed pages is assembled together with the data of further elements, such as register crosses, cut marks and folding marks and print control fields, to form printing originals for a printed sheet. The printed sheet data is likewise provided as color separation values (CMYK).

Different tonal values of a color separation to be reproduced may be reproduced in the print only by surface modulation of the printing inks applied, that is to say by screening. The surface modulation of the printing inks can be carried out, for example, in accordance with a halftone method, in which the various tonal value steps of the color separation data are converted into halftone dots of different size, which are disposed in a regular pattern with periodically repeating halftone cells. During the recording of the color separations on a printing plate, the halftone dots in the individual halftone cells are assembled from exposure points that are an order of magnitude smaller than the halftone dots. A typical resolution of the exposure points is, for example, 1,000 exposure points per centimeter, that is to say an exposure point has the dimensions 10 μm×10 μm. Conversion of the color separation values into halftone dots takes place in a second step during the further processing of the color separation data in the raster image processor, as a result of which the color separation data is converted into high-resolution binary values with only two lightness values (exposed or not exposed) which form the pattern of the modulated dot grid. In this way, the printing original data of each color separation is described in the form of a high-resolution halftone bitmap which, for each of the exposure points on the printed area, contains a bit which indicates whether the exposure point is to be exposed or not.

In the recording devices that are used in electronic reproduction technology for the exposure of printing originals and printing forms, for example a laser beam is produced by a laser diode, shaped by an optical device and focused onto the recording material and deflected over the recording material point-by-point and line by line by a deflection system. There are also recording devices which, in order to increase the exposure speed, produce a bundle of laser beams, for example with a separate laser diode for each laser beam, and expose a plurality of image lines of the printing form simultaneously each time they sweep across the recording material. The printing forms can be exposed onto film material, so that what are known as color separation films are produced, which are then used for the production of printing plates by a photographic copying process. Instead, the printing plates themselves can also be exposed in a plate exposer or directly in a digital press, into which a unit for exposing plates is integrated. The recording material can be located on a drum (external drum exposer), in a cylindrical hollow (internal drum exposer) or on a flat surface (flatbed exposer).

In the case of an external drum exposer, the material to be exposed, in the form of films or printing plates, is mounted on a drum mounted such that it can rotate. While the drum rotates, an exposure head is moved axially along the drum at a relatively short distance. The exposure head focuses one or more laser beams onto the drum surface, sweeping over the drum surface in the form of a narrow helix. In this way, during each drum revolution, one or more image lines are exposed onto the recording material.

During the exposure of the printing originals, care must be taken that the position of the exposed surface, as related to the edges of the recording material or as related to the holes punched in the leading edge for all color separations of a printed sheet, is always the same, since the color separations are subsequently to be printed over one another coincidentally in the press. The punched holes in the printing plates are used for correct positioning when the printing plates are clamped onto the plate cylinder in the press. The position of the exposed surface and the position of the punched holes are determined in relation to a leading edge and one or both side edges of the recording material. The edges of the recording material are brought into a defined position on the exposure drum by contact pins or their position is measured after the material has been clamped on. The starting point of the exposure is then set on the basis of the position of the edges such that the reference to the edges of the recording material is always the same.

In spite of these measures, it is not always ensured that all the color separations coincide during the exposure of printing plates. Printing plates generally have a carrier material of aluminum with a thickness in the range from 0.1 to 0.3 mm. As a result of temperature-induced longitudinal expansion, they change their dimensions by about 24 μm per degree Celsius and per meter edge length. As a rule, the printing plates for all the color separations of a printed sheet are recorded immediately one after another in the same printing plate exposer, so that the fluctuations in the temperature from one recording to the next are so low that they do not play any part. However, it can also occur that the color separations of a printed sheet are recorded on different printing plate exposers that are in different temperature-controlled rooms, or they are exposed at different times. The latter is regularly the case when a printing plate is damaged in the course of further processing and therefore has to be exposed once more. Then, the temperature in the exposer can in the meantime have deviated from the temperature during the first exposure to such an extent that the printing plates had different expansions during the different exposure operations. If the printing plates are subsequently clamped into the press at a standard temperature, the printing plates experience different changes in their length and width, depending on the difference between the standard temperature and the temperature which they had during the exposure. As a result, the color separations from the first exposure and from the re-exposure can deviate from one another in terms of their dimensions in such a way that the register errors can no longer be tolerated.

In order to solve this problem, it may be necessary to set up the printing plate exposers in an air-conditioned room, but this entails restrictions and gives rise to high costs. Another possibility is always to expose all the color separations of a printed sheet once more when re-exposure is needed for one color separation. However, this is costly and time-consuming. A further possibility is to condition the air in the interior of the printing plate exposer. However, in this case, various problems are encountered. In order to reduce the ingress of dust and gases from outside, a slight positive pressure is produced in the interior. The printing plate is fixed on the exposure drum with the aid of a vacuum. During the exposure with powerful laser beams, particles and gases that are produced have to be extracted in order to protect the units in the exposer, in particular the optical components, against contamination. All these different air movements increase the difficulties and the effort involved in implementing an effective air-conditioning system, largely sealed off from external conditions, for the air in the interior of the exposer.

U.S. Pat. No. 5,748,225 A1 discloses a method with which the temperature-dependent expansion or shrinkage of a printing plate to be exposed is compensated for. Using a sensor, the temperature of the printing plate is measured before the exposure and, depending on the difference from a reference temperature, a scale conversion of the color separation data to be exposed is carried out. The scale change is such that all the color separations of a printed sheet have the same dimensions when the relevant printing plates assume the reference temperature, irrespective of the temperature at which they were exposed. The reference temperature can, for example, be the temperature that is subsequently present during printing in the press.

Published, German Patent Application DE 101 37 166 A1, corresponding to published U.S. patent application 2002023557 A1, describes a method of controlling the temperature of the printing plates during printing, in order, with an expansion of the printing plates caused thereby, to compensate for the geometric distortions which the printing material experiences as it passes through a number of printing units as a result of picking up damping solution and of the printing pressure. To this end, a temperature profile that can be adjusted in the circumferential direction is impressed on the printing plate, for example by temperature control elements that are incorporated in the circumferential surface of the plate cylinder. Alternatively, the printing plate temperature is controlled by the ink applicator rolls and the damping solution applicator roll, which can be adjusted to different circumferential temperatures.

The known apparatuses and methods for compensating for or avoiding the temperature-dependent changes in the dimensions of printing plates during exposure are structurally complicated and associated with high costs.

SUMMARY OF THE INVENTION

It is accordingly an object of the invention to provide an apparatus for controlling the temperature of an exposure drum in a printing plate exposer that overcomes the above-mentioned disadvantages of the prior art devices of this general type, which is simple and reliable for controlling the temperature of the exposure drum in an exposer for recording printing originals on printing plates.

With the foregoing and other objects in view there is provided, in accordance with the invention, an apparatus for controlling a temperature of a recording material in an external drum exposer having an exposure drum for holding the recording material. The apparatus contains an internal pipe disposed on an axis of the exposure drum, and at least one rotary lead-through fluidically communicating with and through which a temperature-controlled liquid flows into the internal pipe.

The object is achieved by an apparatus with which, during the exposure, a temperature-controlled liquid is led through the exposure drum, so that the circumferential surface of the exposure drum and the printing plate clamped on the latter assume a defined temperature, irrespective of the external temperature.

In accordance with an added feature of the invention, webs are provided and are connected to the internal pipe. The exposure drum is a cylinder connected to the internal pipe by the webs.

In accordance with another feature of the invention, the cylinder, the internal pipe and the webs are fabricated from a thermally conductive material, preferably aluminum.

In accordance with a further feature of the invention, the cylinder, the internal pipe and the webs are fabricated from an extruded part.

In accordance with an additional feature of the invention, the rotary lead-through is disposed at a first end of the exposure drum with which the temperature-controlled liquid is led into the internal pipe. A further rotary lead-through is disposed at a second end of the exposure drum with which the temperature-controlled liquid is led out of the internal pipe. Alternatively, the rotary lead-through can be a two-way rotary lead-through disposed at one end of the exposure drum, the two-way rotary lead-through leading the temperature-controlled liquid into and out of the internal pipe.

In accordance with a further additional feature of the invention, a temperature control unit is disposed in a path of the temperature-controlled liquid for keeping the temperature-controlled liquid at a constant temperature. Ideally, the temperature-controlled liquid is water and may contain a corrosion-prevention additive and/or an antifreeze additive.

In accordance with a concomitant feature of the invention, the recording material is a printing plate.

Other features which are considered as characteristic for the invention are set forth in the appended claims.

Although the invention is illustrated and described herein as embodied in an apparatus for controlling the temperature of an exposure drum in a printing plate exposer, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
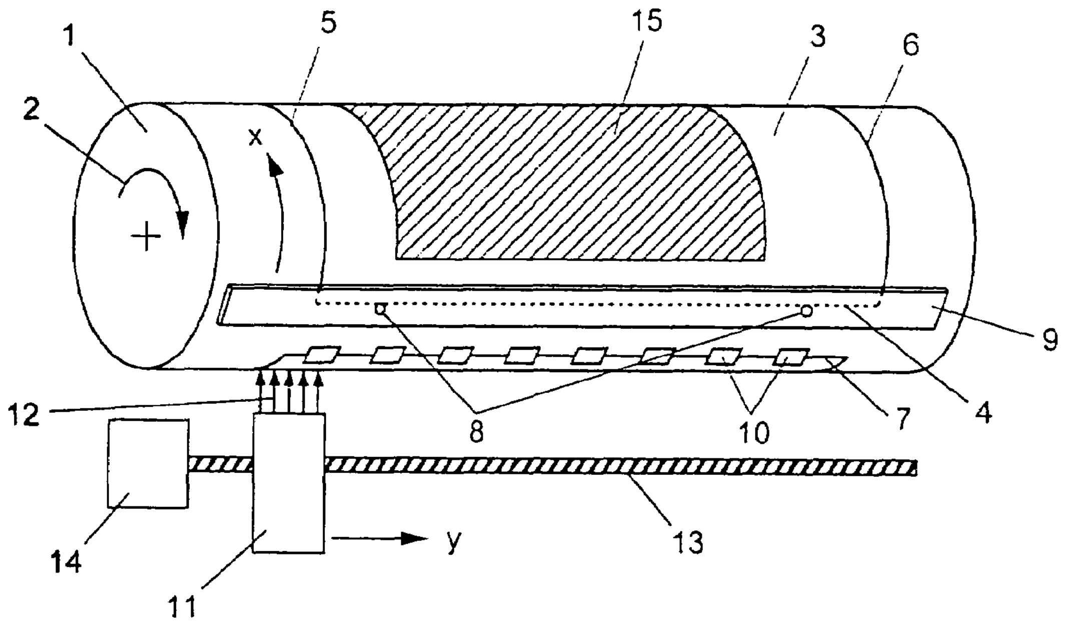
FIG. 1 is a diagrammatic, perspective view of an external drum exposer.

Referring now to the figures of the drawing in detail and first, particularly, to FIG. 1 thereof, there is shown the basic construction of an external drum exposer. An exposure drum 1 is mounted such that it can rotate and can be set into a uniform rotational movement in the direction of rotation arrow 2 by a non-illustrated rotational drive. Clamped onto the exposure drum 1 is an unexposed, rectangular printing plate 3, which has a leading edge 4, a left-hand side edge 5, a right-hand side edge 6 and a trailing edge 7. The printing plate 3 is clamped on in such a way that the leading edge 4 touches contact pins 8 which are firmly connected to the exposure drum 1 and project beyond the surface of the exposure drum 1. A clamping strip 9 presses the leading edge 4 firmly onto the surface of the exposure drum 1 as well and, as a result, fixes the leading edge 4 of the printing plate 3. The printing plate 3 is held flat on the drum surface by a non-illustrated vacuum device, which attracts the printing plate 3 by suction through holes in a drum surface, in order that the printing plate 3 is not loosened by the centrifugal forces during the rotation. Additionally, the trailing edge 7 of the printing plate 3 is fixed by clamping pieces 10.

An exposure head 11 is moved axially along the exposure drum 1 at a relatively short distance as the exposure drum 1 rotates. The exposure head 11 focuses one or more laser beams 12 onto the drum surface, which sweep over the drum surface in the form of narrow helices. In this way, during each drum revolution, one or more image lines are exposed onto the recording material in a circumferential direction x. The exposure head 11 is moved in a feed direction y by a feed spindle 13, to which it is connected by a form fit and which is set moving rotationally by a feed drive 14.

A printing original 15 to be exposed on the printing plate 3 covers only part of the total recording area available. However, for all the color separations that are exposed one after another on different printing plates 3, the printing original 15 must always have the same position in relation to the edges of the printing plate 3 and the same dimensions, in order that no register errors occur later during the over-printing of the color separations. The tolerance of the remaining displacement between the color separations or the remaining different dimensions should be less than 25 μm. The always constant relationship with the leading edge is ensured, for example, by the contact pins 8, against which the leading edge 4 of the printing plate 3 is placed as it is clamped onto the exposure drum 1 before the exposure. The relationship to one of the side edges of the printing plate 3 is ensured by a non-illustrated measuring device, which determines the exact position of one of the side edges after the clamping and places the edge position determined in this way in a relationship with the position of the exposure head 11 at the start of the exposure. By appropriate displacement of the starting point of the exposure, care is taken that the position of the printing original 15 is also always constant in relation to the side edges of the printing plate 3.

Printing plates with an aluminum carrier exhibit a temperature-dependent longitudinal expansion of about 24 μm per degree Celsius and per meter edge length. In spite of the exact relationship between the printing original 15 to be exposed and the plate edges, therefore, the maximum tolerance of 25 μm for a register deviation can be exceeded considerably if the printing originals 15 of the color separations are exposed at different temperatures and the printing plates 3 are then later brought to a standard temperature when they are clamped into the press.

Figure 2:
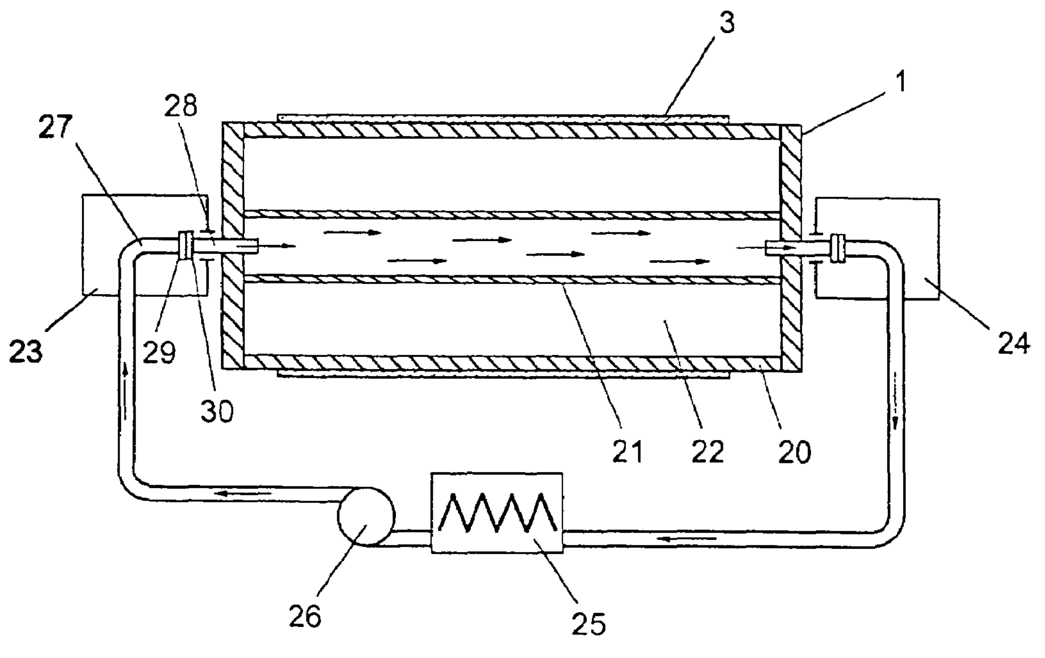
FIG. 2 is a sectional view of a first embodiment of the apparatus according to the invention.
Figure 3:
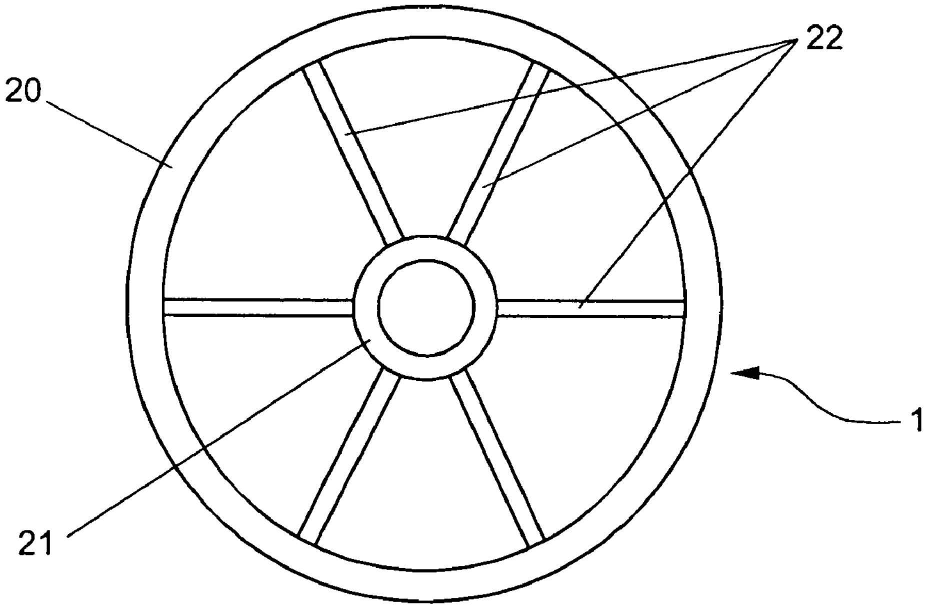
FIG. 3 is a cross-sectional view through an exposure drum.

With the apparatus according to the invention, this problem is solved in that the printing plates 3 are already brought to a defined standard temperature during the exposure, and thus all assume the same expansion. FIG. 2 shows a first embodiment of the apparatus in a schematic longitudinal section through the exposure drum 1 with the printing plate 3 clamped on. The exposure drum 1 is constructed from a cylinder 20 and an internal pipe 21, which are connected by webs 22. FIG. 3 shows this structure again in the view of a cross section through the exposure drum 1. The components forming the cylinder 20, the internal pipe 21 and the webs 22 can be individual elements, from which the exposure drum 1 is assembled. However, the exposure drum 1 can also be fabricated as an extruded part, preferably of aluminum, in the cross-sectional shape of FIG. 3.

The exposure drum 1 is brought to a defined temperature, for example 25 degrees Celsius, by a temperature-control liquid being led through the internal pipe 21. The temperature-control liquid is introduced at one end of the exposure drum 1 by a rotary lead-through 23 and discharged at the other end by a further rotary lead-through 24. The discharged liquid is fed to a temperature control unit 25, where it is heated or cooled, depending on the external temperature, in order to keep it at a constant temperature. It is then fed to the internal pipe 21 again via the rotary lead-through 23. The circulation of the temperature-control liquid is maintained by a pump 26. The temperature-control liquid used is preferably water, which can further be mixed with suitable additives for protection against corrosion and frost.

The rotary lead-throughs 23 and 24 are commercially available components, which can be obtained in various configuration for a great variety of applications. In principle, they contain a stationary pipe 27 and a pipe 28 that is mounted such that it can rotate, is connected to the end of the exposure drum 1 and rotates together with the latter. The stationary pipe 27 is sealed off by a sealing ring 29, and the rotating pipe 28 is sealed off by a sealing ring 30. The sealing rings 29 and 30 slide on each other when the exposure drum 1 rotates, but they seal off the pipes so well that no liquid can emerge from the gap between the sealing rings.

Because of the good thermal conductivity of the aluminum, the temperature of the temperature-control liquid is quickly assumed by the internal pipe 21, passed onto the cylinder 20 via the webs 22 and distributed homogeneously to all the parts of the exposure drum 1. Since the printing plate 3 likewise is formed of aluminum as a carrier material and, by vacuum suction, bears closely against the surface of the exposure drum 1, it likewise assumes the defined constant temperature. By special shaping of the inner surface of the internal pipe 21, for example with longitudinal ribs, the heat transfer between the temperature-control liquid and the internal pipe 21 can be assisted further.

Figure 4:
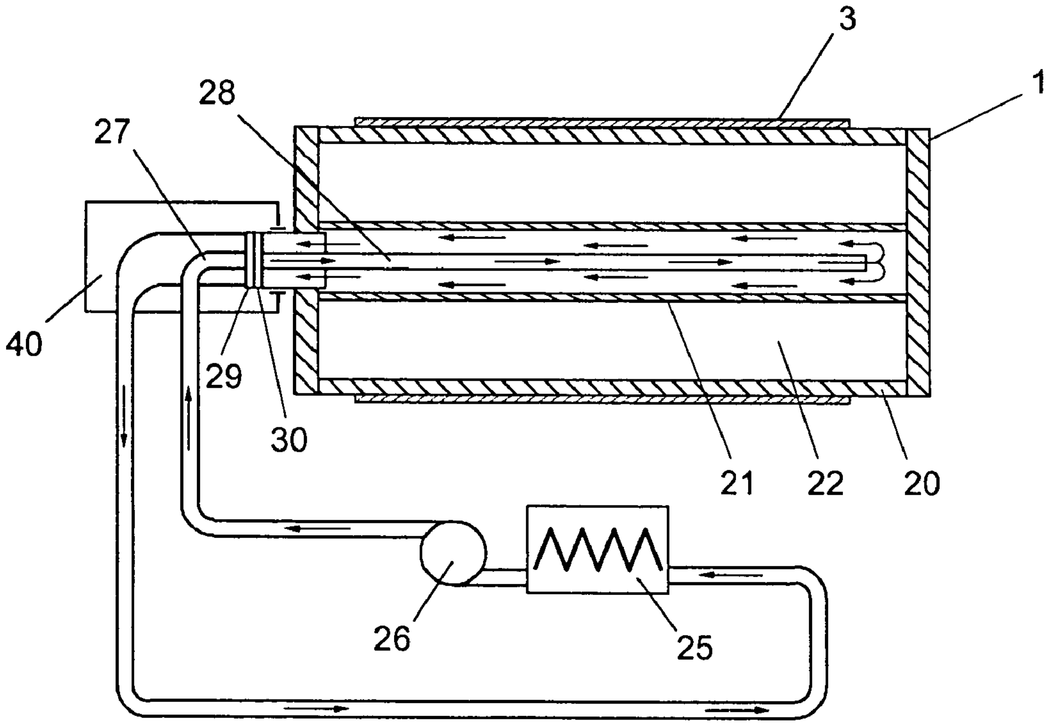
FIG. 4 is a sectional view of a second embodiment of the apparatus according to the invention.

FIG. 4 shows a further embodiment of the apparatus according to the invention. Here, there is only a two-way rotary lead-through 40 at one end of the exposure drum 1, via which lead-through 40 the temperature-control liquid is led to the internal pipe 21 and via which the liquid is also discharged again. To this end, the rotatable pipe 28 is lengthened and reaches virtually as far as the opposite end of the exposure drum 1. At the end of the pipe 28, the temperature-control liquid introduced emerges and then flows back between the outer side of the pipe 28 and the inner surface of the internal pipe 21. Two-way rotary lead-throughs 40 which are suitable for simultaneously leading a liquid through into a rotating body and out again are likewise commercially available.

I claim:

1. An apparatus for controlling a temperature of a printing plate in an external drum exposer having an exposure drum configured as a cylinder for holding the printing plate, the apparatus comprising:

an internal pipe having a longitudinal axis disposed coaxially with an axis of the exposure drum;

at least one rotary lead-through fluidically communicating with said internal pipe for feeding a temperature-controlled liquid directly into and out of said internal pipe such that a flow of the temperature-controlled liquid is confined within said internal pipe; and webs connected to said internal pipe, said webs configured for connecting said internal pipe to the cylinder for effecting heat transfer from the temperature-controlled liquid to the cylinder via said internal pipe and said webs, thereby achieving a defined temperature of the printing plate.

2. The apparatus according to claim 1, wherein the cylinder, said internal pipe and said webs are fabricated from a thermally conductive material.

3. The apparatus according to claim 1, wherein the cylinder, said internal pipe and said webs are fabricated from an extruded part.

4. The apparatus according to claim 1, wherein said rotary lead-through is disposed at a first end of the exposure drum with which the temperature-controlled liquid is led into said internal pipe; and further comprising a further rotary lead-through disposed at a second end of the exposure drum with which the temperature-controlled liquid is led out of said internal pipe.

5. The apparatus according to claim 1, wherein said rotary lead-through is a two-way rotary lead-through disposed at one end of the exposure drum, said two-way rotary lead-through leading the temperature-controlled liquid into and out of said internal pipe.

6. The apparatus according to claim 1, further comprising a temperature control unit disposed in a path of the temperature-controlled liquid for keeping the temperature-controlled liquid at a constant temperature.

7. The apparatus according to claim 1, wherein the temperature-controlled liquid is water.

8. The apparatus according to claim 7, wherein the temperature-controlled liquid further contains at least one of a corrosion-prevention additive and an antifreeze additive.

9. The apparatus according to claim 2, wherein said thermally conductive material is aluminum.

10. The apparatus according to claim 1, wherein the defined temperature of the printing plate is maintained irrespective of an ambient temperature.

11. The apparatus according to claim 1, wherein said webs are longitudinal webs running along the axis of the exposure drum over substantially an entire length of the exposure drum.

12. The apparatus according to claim 1, wherein said internal pipe has an inner surface with longitudinal ribs therein.

13. An exposer for controlling a temperature of a printing plate, comprising:

an exposure head for exposing the printing plate;

an exposure drum configured as a cylinder for holding the printing plate and having an axis;

an internal pipe having a longitudinal axis disposed coaxially with said axis of said exposure drum; and at least one rotary lead-through fluidically communicating with said internal pipe for feeding a temperature-controlled liquid directly into and out of said internal pipe such that a flow of the temperature-controlled liquid is confined within said internal pipe; and webs connected to said internal pipe, said webs connecting said internal pipe to said cylinder for effecting heat transfer from the temperature-controlled liquid to said cylinder via said internal pipe and said webs, thereby achieving a defined temperature of the printing plate.

14. An exposure drum for controlling a temperature of a printing plate, comprising:

a cylindrical body for holding the printing plate and having an axis;

an internal pipe having a longitudinal axis disposed coaxially with said axis of said cylindrical body; and at least one rotary lead-through fluidically communicating with said internal pipe for feeding a temperature-controlled liquid directly into and out of said internal pipe such that a flow of the temperature-controlled liquid is confined within said internal pipe; and webs connected to said internal pipe, said webs connecting said internal pipe to said cylindrical body for effecting heat transfer from the temperature-controlled liquid to said cylindrical body via said internal pipe and said webs, thereby achieving a defined temperature of the printing plate.

* * * * *